(12) United States Patent
Hur

(10) Patent No.: US 12,365,975 B2
(45) Date of Patent: Jul. 22, 2025

(54) SPUTTERING APPARATUS AND CVD MASK COATING METHOD USING THE SAME

(71) Applicant: SAMSUNG DISPLAY CO., LTD., Yongin-si (KR)

(72) Inventor: Sungmin Hur, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 79 days.

(21) Appl. No.: 17/936,471

(22) Filed: Sep. 29, 2022

(65) Prior Publication Data

US 2023/0220533 A1    Jul. 13, 2023

(30) Foreign Application Priority Data

Jan. 10, 2022    (KR) .................... 10-2022-0003196

(51) Int. Cl.
| | | |
|---|---|---|
| C23C 14/00 | (2006.01) | |
| C23C 14/34 | (2006.01) | |
| C23C 16/04 | (2006.01) | |
| H01J 37/32 | (2006.01) | |
| H01J 37/34 | (2006.01) | |

(52) U.S. Cl.
CPC ...... *C23C 14/0063* (2013.01); *C23C 14/3407* (2013.01); *C23C 16/042* (2013.01); *H01J 37/32449* (2013.01); *H01J 37/3417* (2013.01); *H01J 2237/332* (2013.01)

(58) Field of Classification Search
None
See application file for complete search history.

(56) References Cited

U.S. PATENT DOCUMENTS

| | | | |
|---|---|---|---|
| 9,340,868 B2 | 5/2016 | Hwang et al. | |
| 9,530,622 B2 | 12/2016 | Fukasawa et al. | |
| 2004/0118678 A1* | 6/2004 | Hartig | C23C 14/56 204/298.14 |
| 2008/0041716 A1* | 2/2008 | Alpay | G03F 1/26 204/192.2 |
| 2013/0228452 A1* | 9/2013 | De Bosscher | H01J 37/3405 204/192.12 |
| 2016/0233056 A1* | 8/2016 | Hartig | C23C 14/14 |
| 2021/0079518 A1 | 3/2021 | Kim et al. | |

FOREIGN PATENT DOCUMENTS

| | | |
|---|---|---|
| CN | 112509913 | 3/2021 |
| KR | 10-2014-0036765 | 3/2014 |
| KR | 10-1801794 | 11/2017 |
| KR | 10-2194915 | 12/2020 |
| KR | 10-2021-0032606 | 3/2021 |

* cited by examiner

*Primary Examiner* — Jason Berman
(74) *Attorney, Agent, or Firm* — F. CHAU & ASSOCIATES, LLC

(57) ABSTRACT

A sputtering apparatus includes a rotary target extending in a first direction, a gas supply bar disposed on the rotary target, and a substrate holder positioned opposite the gas supply bar with respect to the rotary target. The gas supply bar includes a first flow path extending in the first direction, and a second flow path spaced apart from the first flow path in the first direction and separated from the first flow path.

20 Claims, 11 Drawing Sheets

SPUTTERING APPARATUS AND CVD MASK COATING METHOD USING THE SAME

CROSS-REFERENCE TO RELATED APPLICATIONS

This U.S. non-provisional patent application claims priority under 35 U.S.C. § 119 of Korean Patent Application No. 10-2022-0003196, filed on Jan. 10, 2022, the entire disclosure of which is incorporated by reference herein.

1. TECHNICAL FIELD

The present disclosure herein relates to a sputtering apparatus and a chemical vapor deposition (CVD) mask coating method using the same.

2. DISCUSSION OF RELATED ART

Electronic devices that provide a user with an image, such as smart phones, digital cameras, laptop computers, navigation units, and smart televisions, include a display apparatus for displaying the image. The display apparatus generates an image and provides the generated image to a user through a display screen. During the manufacturing process of the display apparatus, a chemical vapor deposition (CVD) process may be used.

In a typical CVD process, a substrate is exposed to one or more volatile precursors, which react and/or decompose on the substrate to produce a desired deposit. A mask may be used to define a deposition range of the deposit. The mask may be exposed to plasma during processing. However, the mask may be damaged by the plasma and need to be replaced after a certain period of time.

SUMMARY

At least one embodiment of the present disclosure provides a sputtering apparatus capable of coating a layer with a uniform thickness, and a CVD mask coating method using the same.

An embodiment of the inventive concept provides a sputtering apparatus including a rotary target (or a portion), a gas supply bar, and a substrate holder. The rotary target extends in a first direction. The gas supply bar is disposed on the rotary target. The substrate holder is positioned opposite the gas supply bar with respect to the rotary target. The gas supply bar includes a first flow path extending in the first direction, and a second flow path spaced apart from the first flow path in the first direction and separated from the first flow path.

In an embodiment of the inventive concept, a sputtering apparatus includes a first rotary target, a second rotary target, and a gas supply bar. The first rotary target extends in a first direction. The second rotary target extends in the first direction and is spaced apart from the first rotary in a second direction different from the first direction. The gas supply bar is spaced apart from the first rotary target and the second rotary target in a third direction different form each of the first direction and the second direction. For example, the directions may cross one another. The gas supply bar includes a first flow path extending in the first direction, and a second flow path spaced apart from the first flow path in the first direction and separated from the first flow path.

In an embodiment of the inventive concept, a chemical vapor deposition (CVD) mask coating method includes: disposing a CVD mask on a substrate holder of a sputtering apparatus; applying a vacuum pressure to inside of the sputtering apparatus; supplying a process gas to the inside of the sputtering apparatus; and applying an AC voltage to the rotary target. The rotary target has a cylindrical shape extending in a first direction.

BRIEF DESCRIPTION OF THE DRAWINGS

The accompanying drawings illustrate embodiments of the inventive concept and, together with the description, serve to explain principles of the inventive concept. In the drawings.

DETAILED DESCRIPTION

Figure 1:
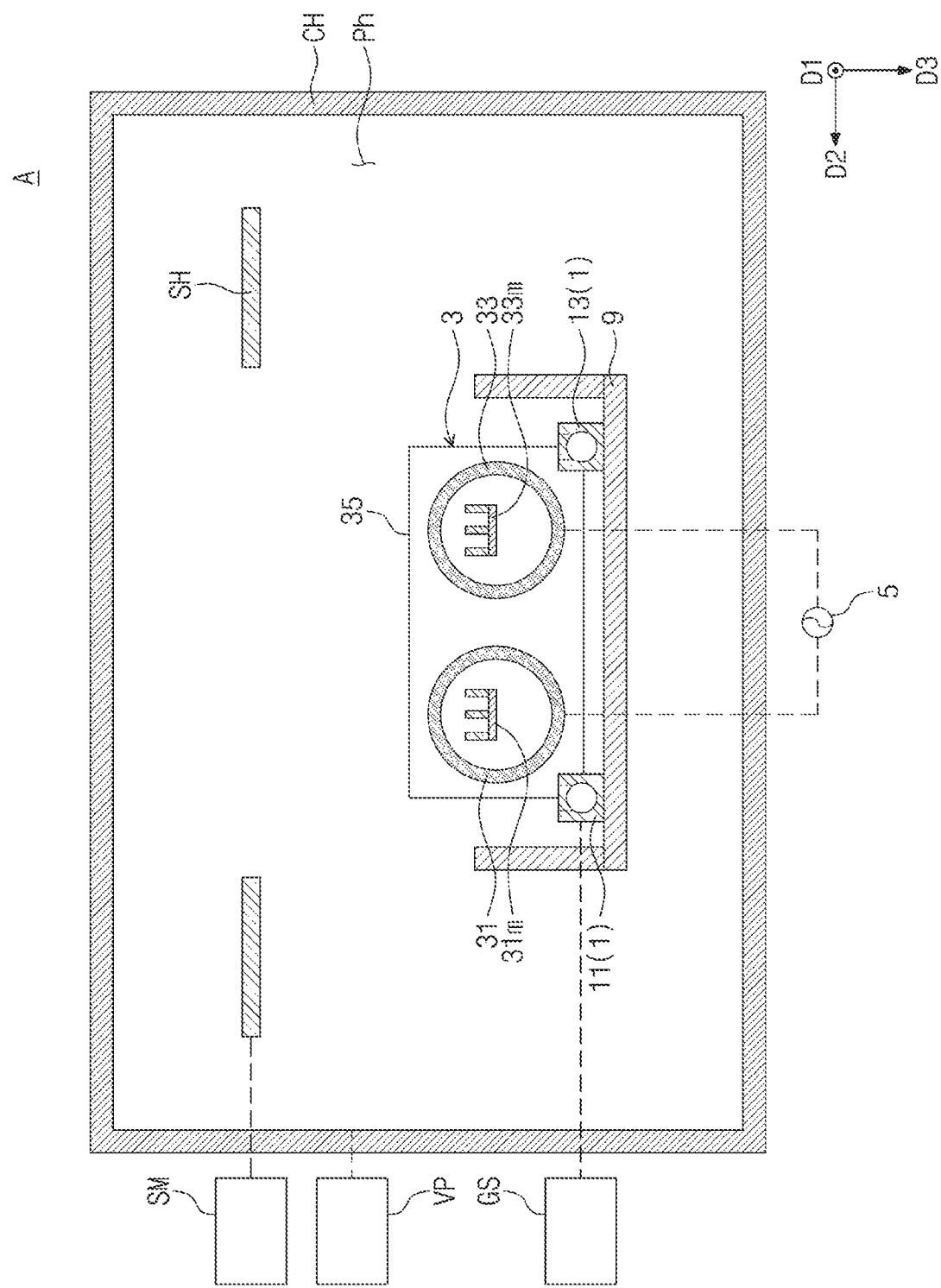
FIG. 1 is a schematic view illustrating a sputtering apparatus according to an embodiment of the inventive concept.

In this specification, when an element (or a region, a layer, a portion, or the like) is referred to as "being on", "being connected to", or "being coupled to" another element, it may be directly disposed/connected/coupled to another element, or an intervening third element may also be disposed therebetween.

Like numbers refer to like elements throughout. Also, in the drawings, the thicknesses, ratios, and dimensions of the elements may be exaggerated for effective description of the technical contents. "And/or" herein includes one or more combinations which may be defined by the associated elements.

Although the terms first, second, etc. may be used to describe various elements, these elements should not be limited by these terms. These terms are only used to distinguish one element from another element. For example, a first element may be referred to as a second element, and similarly, a second element may also be referred to as a first element without departing from the scope of the present disclosure. The singular forms include the plural forms as well, unless the context clearly indicates otherwise.

Also, terms of "below", "on lower side", "above", "on upper side", or the like may be used to describe the relationships of the elements illustrated in the drawings. These terms have relative concepts and are described on the basis of the directions indicated in the drawings.

It will be understood that the term "includes" or "comprises", when used in this specification, specifies the presence of stated features, integers, steps, operations, elements, components, or a combination thereof, but does not preclude the presence or addition of one or more other features, integers, steps, operations, elements, components, or combinations thereof.

Hereinafter, a display apparatus and a light-emitting element according to an embodiment of the inventive concept will be described with reference to the accompanying drawings.

Figure 2:
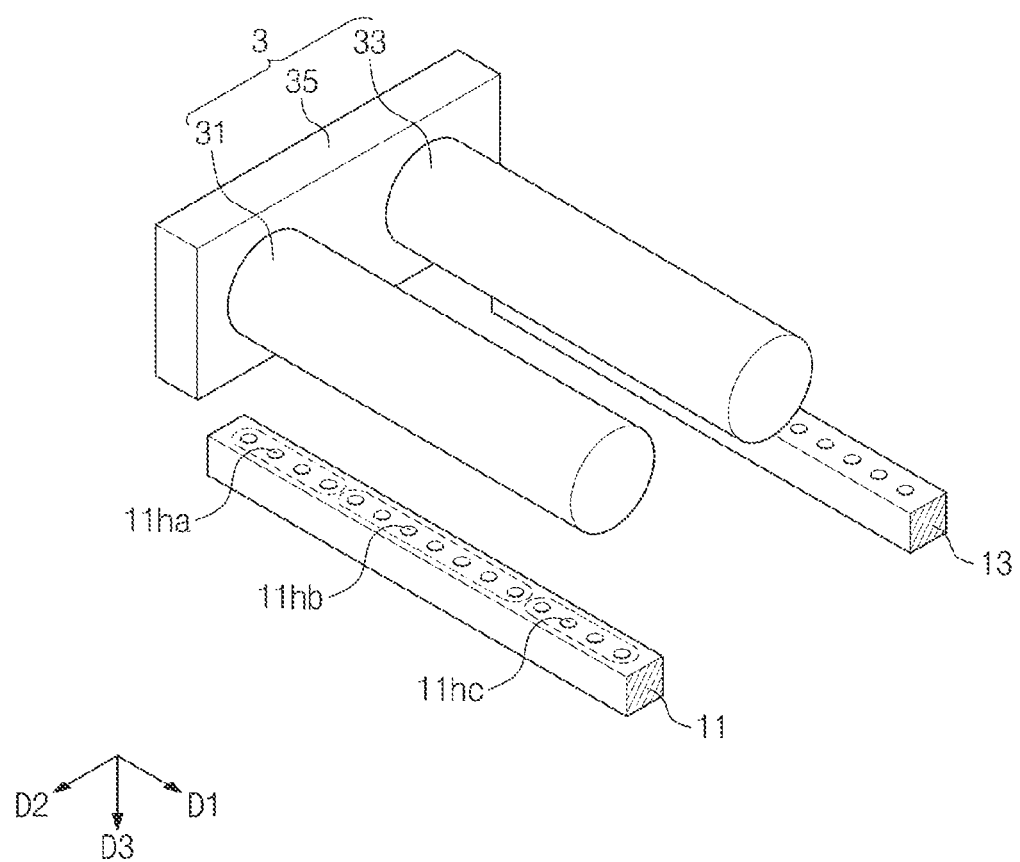
FIG. 2 is a perspective view illustrating a part of a sputtering apparatus according to an embodiment of the inventive concept.

FIG. 1 is a schematic view illustrating a sputtering apparatus according to an embodiment of the inventive concept, and FIG. 2 is a perspective view illustrating a part of a sputtering apparatus according to an embodiment of the inventive concept.

Hereinafter, D1 in FIG. 1 may be referred to as a first direction, D2 crossing the first direction D1 may be referred to as a second direction, and D3 crossing the first direction D1 and the second direction D2 may be referred to as a third direction. The third direction D3 may be referred to as a vertical direction, and each of the first direction D1 and the second direction D2 may be referred to as a horizontal direction.

Referring to FIGS. 1 and 2, a sputtering apparatus A is provided. The sputtering apparatus A may be used to perform a sputtering process. That is, the sputtering apparatus A may be used to deposit a target material on the surface of a substrate. For example, the sputtering apparatus A may be used to coat a target material on a surface of a chemical vapor deposition (CVD) mask that is used in a CVD process. More specifically, the sputtering apparatus A may be used to coat the CVD mask with a material such as aluminum oxide ($AlO_x$). The CVD mask may include Invar such as Invar 36. However, embodiments of the inventive concept are not limited thereto, and the sputtering apparatus A may be used to deposit different target materials on different objects.

The sputtering apparatus A may include a process chamber CH, a substrate holder SH, a substrate moving device SM, a vacuum pump VP, a target device 3, a gas supply bar 1, a support unit 9 (e.g., a support), a voltage application device 5 and a gas supply unit GS (e.g., a gas supplying device). For example, the substrate holder SH may be a platform, or a pair of platforms spaced apart from one another. Additional supports may be present on a surface of the support unit 9, and a rotation driving device 35 may be present between these additional supports. For example, the shaded pair of vertical rectangles depicted in FIG. 1 adjacent in contact with the support unit 9 may be these additional supports. For example, one of the additional supports may next to the first gas supply bar 11 and the other of the additional supports may next to the second gas supply bar 13.

The process chamber CH may provide a process space Ph. For example, the process chamber CH may include a hollow interior. A substrate and a target material may be disposed in the process space Ph. In the process space Ph, a sputtering deposition process may be performed on the substrate. During the process, the process space Ph may be maintained to be in a state close to a vacuum state. This will be described in detail later.

The substrate holder SH may support the substrate. For example, when the surface of the CVD mask is coated using the sputtering apparatus A, the substrate holder SH may support the CVD mask. In addition, the substrate holder SH may move the substrate. More specifically, the substrate holder SH may move in a horizontal direction while supporting the substrate, and thus allow the substrate to move. The substrate holder SH may be spaced a predetermined distance from the target device 3. More specifically, the substrate holder SH may be positioned on the opposite side of the gas supply bar 1 with respect to the target device 3. For example, the substrate holder SH may be positioned opposite the gas supply bar 1 with respect to the target device 3.

The substrate moving device SM may move the substrate holder SH. For example, the substrate moving device SM may move the substrate holder SH in the second direction D2. To this end, the substrate moving device SM may include an actuator such as an electric motor or a hydraulic motor. As illustrated in FIG. 1, the substrate moving device SM may be positioned outside the process chamber CH, but embodiments of the inventive concept are not limited thereto.

The vacuum pump VP may be connected to the process chamber CH. The vacuum pump VP may provide a vacuum pressure to the process space Ph. Using the vacuum pump VP may maintain the process space Ph in a state close to a vacuum state during the process.

The target device 3 may be positioned between the substrate holder SH and the gas supply bar 1. The target device 3 may include a first rotary target 31, a second rotary target 33, and a rotation driving device 35. For example, each of the first rotary target 31 and the second rotary target 33 may be a cylinder or a disc or another shape capable of rotating about an axis. In an embodiment, one of the rotary targets is omitted.

The first rotary target 31 (e.g., an object, a portion, etc.) may include a target material. For example, the first rotary target 31 may include aluminum (Al). In this case, aluminum oxide ($AlO_x$) may be deposited on the substrate supported by the substrate holder SH. However, embodiments of the inventive concept are not limited thereto, and the first rotary target 31 may include at least one of titanium (Ti), silicon (Si), tantalum (Ta), or zinc (Zn). The first rotary target 31 may extend in the first direction D1. The first rotary target 31 may have a round, circular, oval or cylindrical shape. The first rotary target 31 may be rotatable. For example, the first rotary target 31 may rotate about an axis parallel to the first direction D1 by the rotation driving device 35. A first inner magnet 31m may be provided inside the first rotary target 31. The first inner magnet 31m may control the position of an ionized fluid. For example, the first inner magnet 31m may generate a magnetic field that changes directions or positions of ionized particles within the space Ph.

The second rotary target 33 (e.g., an object, a portion, etc.) and the first rotary target 31 may include substantially the same material. That is, the second rotary target 33 may include at least one of aluminum (Al), titanium (Ti), silicon (Si), tantalum (Ta), or zinc (Zn). The second rotary target 33 may extend in the first direction D1. The second rotary target 33 may have a cylindrical shape. The second rotary target 33 may rotatable together with the first rotary target 31. A second inner magnet 33m may be provided inside the second rotary target 33. For example, the second inner magnet 33m may generate a magnetic field that changes positions of ionized particles within the space Ph. The second rotary target 33 may be horizontally spaced apart from the first rotary target 31. For example, the second rotary target 33 may be spaced apart from the first rotary target 31 in the second direction D2. A level of the second rotary target 33 and a level of the first rotary target 31 may be substantially the same, but embodiments of the inventive concept are not limited thereto.

The rotation driving device 35 may be connected to one end of each of the first rotary target 31 and the second rotary target 33. The rotation driving device 35 may rotate each of the first rotary target 31 and the second rotary target 33. The rotation driving device 35 may include an actuator such as an electric motor or a hydraulic motor to rotate each of the first rotary target 31 and the second rotary target 33. The rotation driving device 35 may be positioned in the process space Ph, but embodiments of the inventive concept are not limited thereto.

The gas supply bar 1 may inject a process gas into the process space Ph. The gas supply bar 1 may be connected to the gas supply unit GS. The process gas supplied from the gas supply unit GS may be dispersed through the gas supply bar 1 and injected into the process space Ph. The gas supply bar 1 may be positioned on the opposite side of the substrate holder SH with respect to the target device 3. The gas supply bar 1 may be provided in plurality. For example, the gas supply bar 1 may include a first gas supply bar 11 and a second gas supply bar 13.

The first gas supply bar 11 may extend in the same direction as the first rotary target 31. That is, the first gas supply bar 11 may extend in the first direction D1. The first gas supply bar 11 may include a plurality of injection holes 11ha, 11hb, and 11hc which are defined therein. The plurality of injection holes 11ha, 11hb, and 11hc may be spaced apart from each other in the first direction D1. This will be described in detail later.

The second gas supply bar 13 may be spaced apart from the first gas supply bar 11 in the second direction D2. The second gas supply bar 13 may have a configuration substantially identical or similar to that of the first gas supply bar 11. Therefore, for convenience sake, description will be focused on the first gas supply bar 11.

The support unit 9 may support the gas supply bar 1 and the target device 3, and the like. The gas supply bar 1 and the target device 3 may be fixed at a predetermined position in the process chamber CH by the support unit 9.

The voltage application device 5 may apply a voltage to the target device 3. More specifically, the voltage application device 5 may apply an alternating current (AC) voltage to the first rotary target 31 and the second rotary target 33. That is, the voltage application device 5 may be an AC power source. This will be described in detail later.

The gas supply unit GS may supply a process gas into the process chamber CH. More specifically, the gas supply unit GS may inject the process gas into the process space Ph through the gas supply bar 1. To this end, the gas supply unit GS may include a gas tank, a gas flow path, a gas valve, and the like. The gas supply unit GS may supply various types of process gases. For example, the gas supply unit GS may store and supply oxygen ($O_2$), nitrogen ($N_2$), and/or argon (Ar). However, embodiments of the inventive concept are not limited thereto, and the gas supply unit GS may supply other types of process gases.

Figure 3:
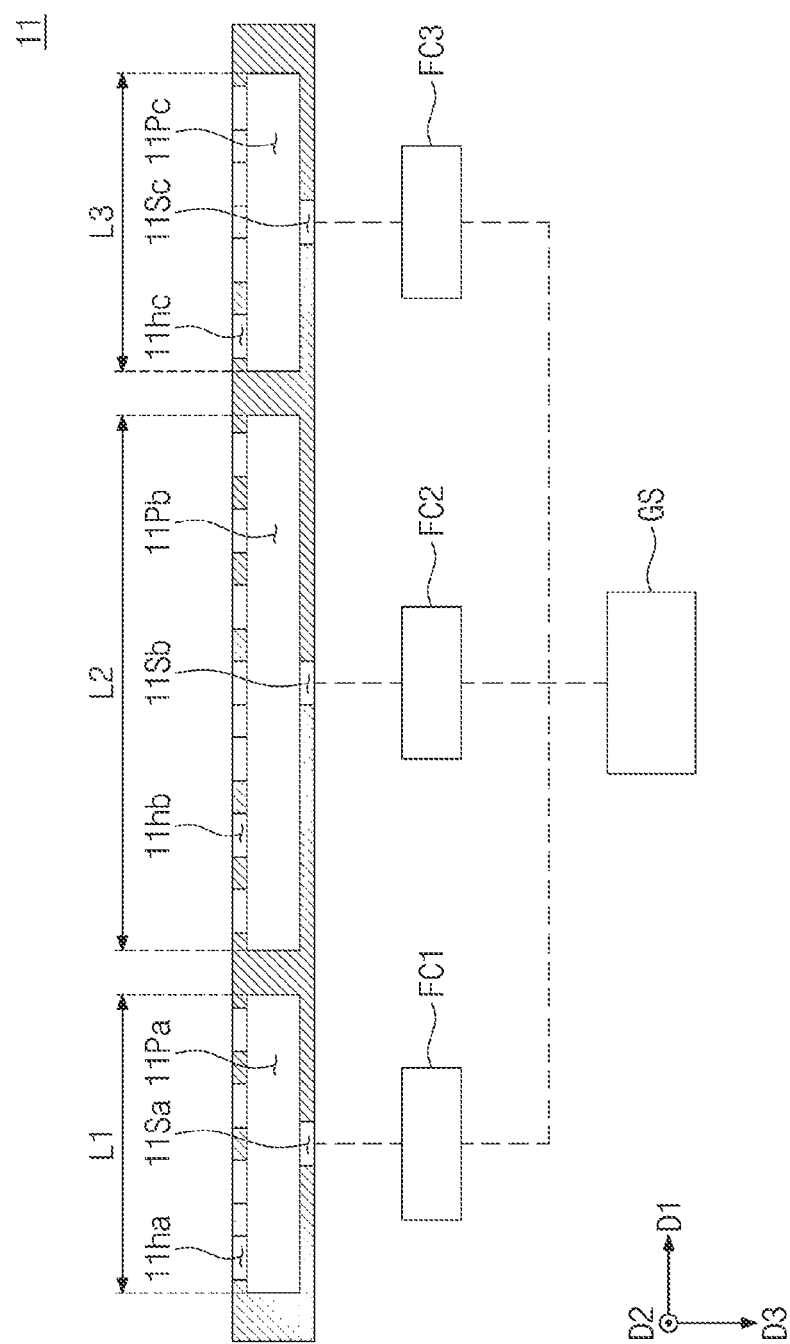
FIG. 3 is a cross-sectional view illustrating a gas supply bar of a sputtering apparatus according to an embodiment of the inventive concept.

FIG. 3 is a cross-sectional view illustrating a gas supply bar of a sputtering apparatus according to an embodiment of the inventive concept.

Referring to FIG. 3, the first gas supply bar 11 may include a first flow path 11Pa, a second flow path 11Pb, and a third flow path 11Pc which are defined therein.

The first flow path 11Pa may be a space extending by a predetermined length in the first direction D1 within the first gas supply bar 11. The length of the first flow path 11Pa in the first direction D1 may be referred to as a first length L1.

The second flow path 11Pb may be a space extending by a predetermined length in the first direction D1 within the first gas supply bar 11. The second flow path 11Pb may be spaced apart from the first flow path 11Pa in the first direction D1. The second flow path 11Pb may be separated from the first flow path 11Pa. For example, an interior wall may be present between the first flow path 11Pa and the second flow path 11Pb. That is, in the first gas supply bar 11, the first flow path 11Pa and the second flow path 11Pb may not be connected to each other. Accordingly, a fluid in the first flow path 11Pa is unable to move to the second flow path 11Pb. That is, the first flow path 11Pa and the second flow path 11Pb may be separated so that the fluid may be unable to move therebetween. The length of the second flow path 11Pb in the first direction D1 may be referred to as a second length L2. In an embodiment, the second length L2 is different from the first length L1. For example, the second length L2 may be greater than the first length L1. More specifically, a ratio of the first length L1 to the second length L2 may be about 1:1.5. In an embodiment, the second length L2 is 1.5 times the first length L1. However, embodiments of the inventive concept are not limited thereto, and the ratio between the first length L1 and the second length L2 may vary according to a specific design application.

The third flow path 11Pc may be a space extending by a predetermined length in the first direction D1 within the first gas supply bar 11. The third flow path 11Pc may be spaced apart from the second flow path 11Pb in the first direction D1. The third flow path 11Pc may be separated from the second flow path 11Pb. For example, an interior wall may be present between the second flow path 11Pb and the third flow path 11Pc. That is, in the first gas supply bar 11, the second flow path 11Pb and the third flow path 11Pc may not be connected to each other. Accordingly, a fluid in the second flow path 11Pb is unable to move to the third flow path 11Pc. That is, the second flow path 11Pb and the third flow path 11Pc may be separated so that the fluid may be unable to move therebetween. The length of the third flow path 11Pc in the first direction D1 may be referred to as a third length L3. In an embodiment, the third length L3 is different from the second length L2. For example, the first length L3 may be smaller than the second length L2. More specifically, a ratio of the second length L2 to the third length L3 may be about 1.5:1. In an embodiment, the second length L2 is 1.5 times the third length L3. However, embodiments of the inventive concept are not limited thereto, and a ratio between the second length L2 and the third length L3 may be changed according to a specific design application.

The first gas supply bar 11 may further include a first injection hole 11ha, a second injection hole 11hb, and a third injection hole 11hc which are defined therein.

The first injection hole 11ha may be connected to the first flow path 11Pa. For example, the first injection hole 11ha may be an exit of the first flow path 11Pa. The first injection hole 11ha may extend vertically from the first flow path 11Pa to expose the first flow path 11Pa to the outside. That is, the first injection hole 11ha may extend from the first flow path 11Pa to the first rotary target 31 (see FIG. 2), and may connect the first flow path 11Pa to the process space Ph (see FIG. 1). The first injection hole 11ha may be provided in plurality. The plurality of first injection holes 11ha may be spaced apart from each other in the first direction DR. For example, interior walls may be located between the first injection holes 11ha. However, for convenience, the first injection hole 11ha will be described below in a singular form.

The second injection hole 11hb may be connected to the second flow path 11Pb. The second injection hole 11hb may extend vertically from the second flow path 11Pb to expose the second flow path 11Pb to the outside. The second injection hole 11hb may be an exit of the second flow path 11Pb. The second injection hole 11hb may be provided in plurality. The plurality of second injection holes 11hb may be spaced apart from each other in the first direction D1. For example, interior walls may be located between the second injection holes 11hb. However, for convenience, the second injection hole 11hb will be described herebelow in a singular form.

The third injection hole 11hc may be connected to the third flow path 11Pc. The third injection hole 11hc may extend vertically from the third flow path 11Pc to expose the third flow path 11Pc to the outside. The third injection hole 11hc may be an exit of the third flow path 11Pc. The third injection hole 11hc may be provided in plurality. The plurality of third injection holes 11hc may be spaced apart from each other in the first direction D1. For example, interior walls may be located between the third injection holes 11hc. However, for convenience, the third injection hole 11hc will be described herebelow in a singular form.

The first gas supply bar 11 may further include a first supply flow path 11Sa, a second supply flow path 11Sb, and a third flow path 11Sc which are defined therein.

The first supply flow path 11Sa may connect the gas supply unit GS and the first supply flow path 11Pa. For example, the first supply flow path 11Sa may extend from below the first supply flow path 11Pa and may connect the first supply flow path 11Pa to the outside.

The second supply flow path 11Sb may connect the gas supply unit GS and the second flow path 11Pb. For example, the second supply flow path 11Sb may extend from below the second supply flow path 11Pb and may connect the second supply flow path 11Pb to the outside. In addition, the second supply flow path 11Sb may be spaced apart from the first flow path 11Sa in the first direction D1.

The third supply flow path 11Sc may connect the gas supply unit GS and the third flow path 11Pc. For example, the third supply flow path 11Sc may extend from below the third supply flow path 11Pc and may connect the third supply flow path 11Pc to the outside. In addition, the third flow path 11Sc may be spaced apart from the second flow path 11Sb in the first direction D1. For example, an interior wall may be present between the second flow path 11Sb and the third flow path 11Sc.

The sputtering apparatus A (see FIG. 1) may further include a first flow rate control device FC1, a second flow rate control device FC2, and a third flow rate control device FC3.

The first flow rate control device FC1 may be positioned between the first supply flow path 11Sa and the gas supply unit GS. The first flow rate control device FC1 may control the flow rate of the process gas that is supplied from the gas supply unit GS to the first flow path 11Pa. To this end, the first flow rate control device FC1 may include a mass flow controller (MFC) or the like.

The second flow rate control device FC2 may be positioned between the second supply flow path 11Sb and the gas supply unit GS. The second flow rate control device FC2 may control the flow rate of the process gas that is supplied from the gas supply unit GS to the second flow path 11Pb. To this end, the second flow rate control device FC2 may include a MFC or the like.

The third flow rate control device FC3 may be positioned between the third supply flow path 11Sc and the gas supply unit GS. The third flow rate control device FC3 may control the flow rate of the process gas that is supplied from the gas supply unit GS to the third flow path 11Pc. To this end, the third flow rate control device FC3 may include a MFC or the like.

Figure 4:
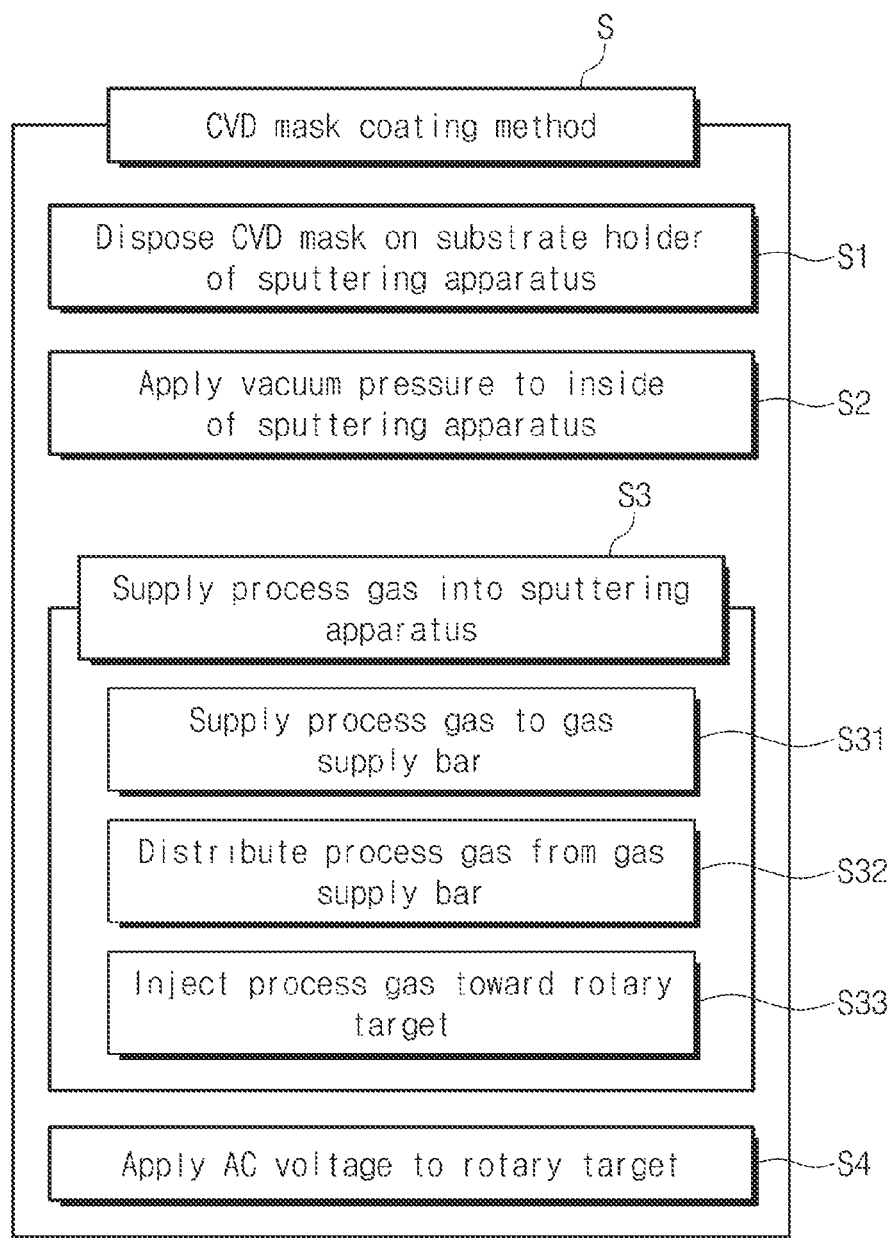
FIG. 4 is a flowchart illustrating a CVD mask coating method using a sputtering apparatus according to an embodiment of the inventive concept.

FIG. 4 is a flowchart illustrating a CVD mask coating method using a sputtering apparatus according to an embodiment of the inventive concept.

Referring to FIG. 4, a CVD mask coating method (S) may be provided. The CVD mask coating method (S) may be a method of coating the surface of a CVD mask using the sputtering apparatus A (see FIG. 1) described with reference to FIGS. 1 to 3. The CVD mask coating method (S) include disposing the CVD mask on a substrate holder (e.g., SH) of the sputtering apparatus (51), applying vacuum pressure to the inside of the sputtering apparatus (S2), supplying a process gas into the sputtering apparatus (S3), and applying an AC voltage to the rotary target (S4).

The supplying of the process gas into the sputtering apparatus (S3) may include supplying the process gas to the gas supply bar (S31), distributing the process gas from the gas supply bar (S32), and injecting the process gas toward the rotary target (S33).

Hereinafter, the CVD mask coating method (S) of FIG. 4 will be described in detail with reference to FIGS. 5 to 8.

FIGS. 5 to 8 are views sequentially illustrating a CVD mask coating method according to the flowchart of FIG. 4.

Figure 5:
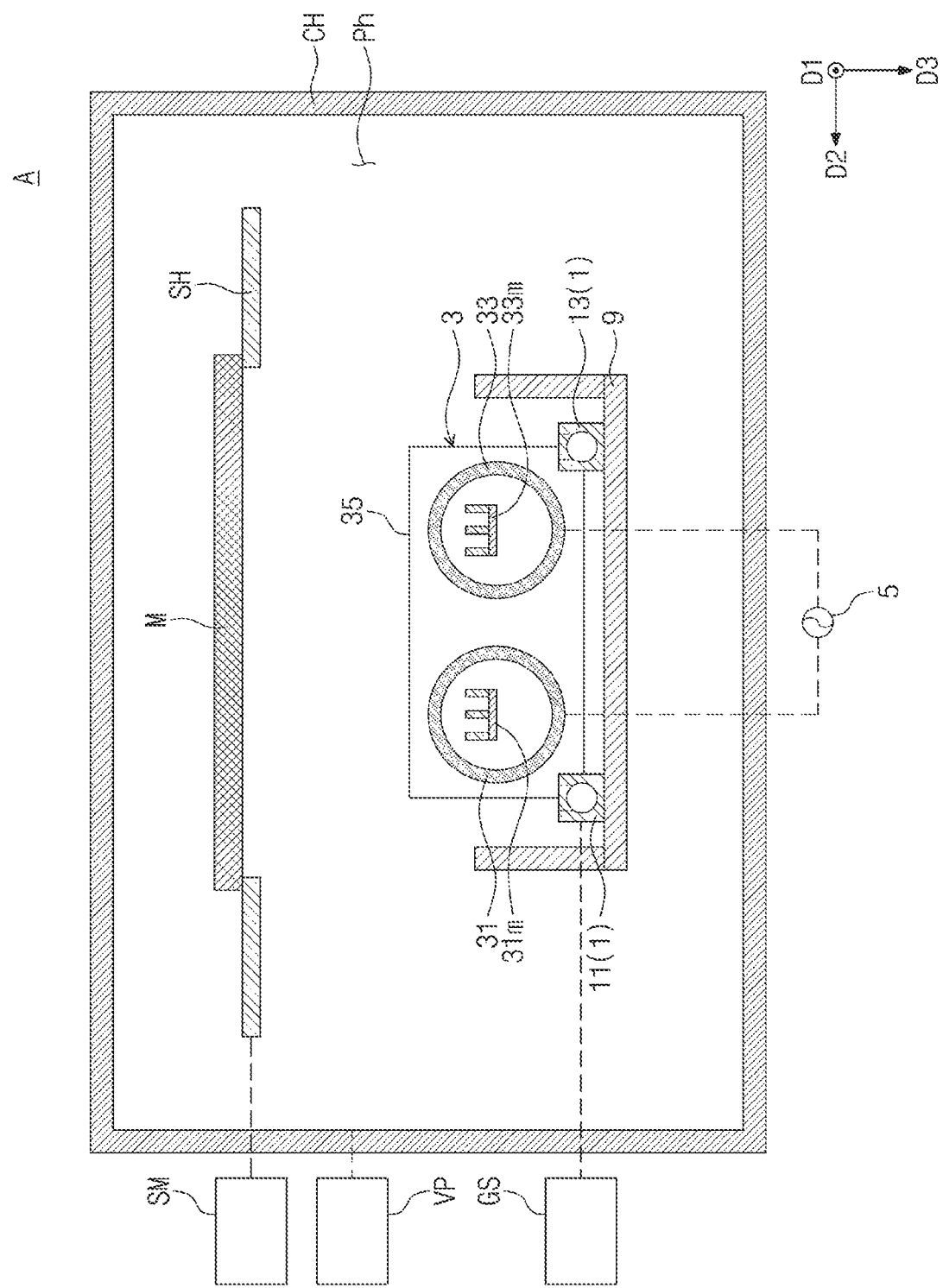
FIGS. 5 to 8 are views sequentially illustrating a CVD mask coating method according to the flowchart of FIG. 4.

Referring to FIG. 5 together with FIG. 4, the disposing of the CVD mask on the substrate holder of the sputtering apparatus (51) may include disposing the CVD mask M on the substrate holder SH to face the target device 3. The substrate holder SH may include two supports spaced apart from one another to hold the CVD mask M. The CVD mask M may be a mask disposed on a substrate to define a deposition region in a CVD process. The CVD mask M may be loaded into the process chamber CH through various methods. For example, the CVD mask M may be inserted into the process space Ph by a robot arm and disposed on the substrate holder SH. However, embodiments of the inventive concept are not limited thereto, and the CVD mask M may be loaded on the substrate holder SH through another method.

The applying of the vacuum pressure to the inside of the sputtering apparatus (S2) may include performing a process to set the inside of the process chamber CH to a state close to a vacuum state by suctioning fluid in the process space Ph by the vacuum pump VP. A separate pressure control device different from the vacuum pump VP may be provided to finely control or adjust the pressure of the process space Ph.

Figure 6:
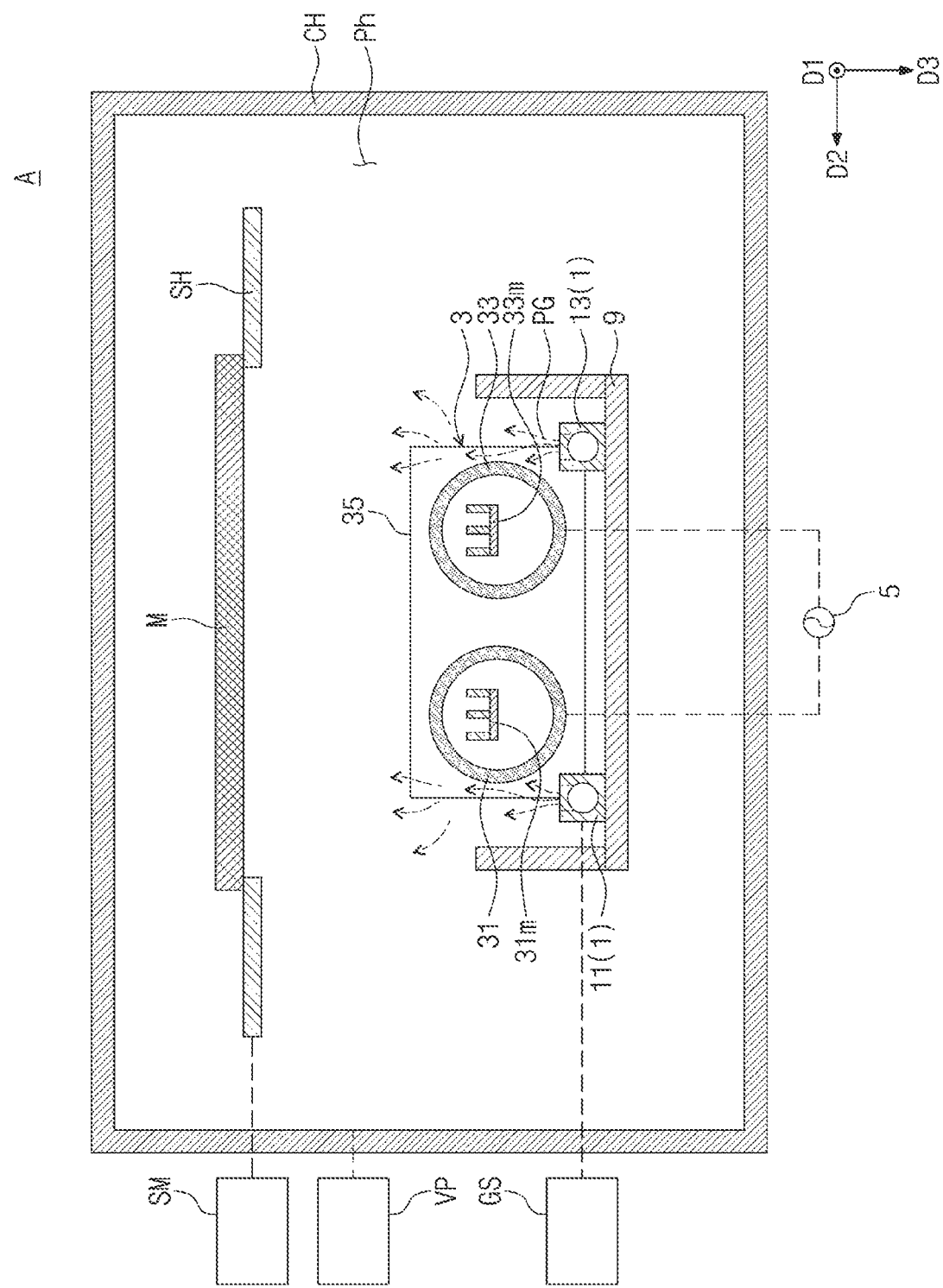
Figure 7:
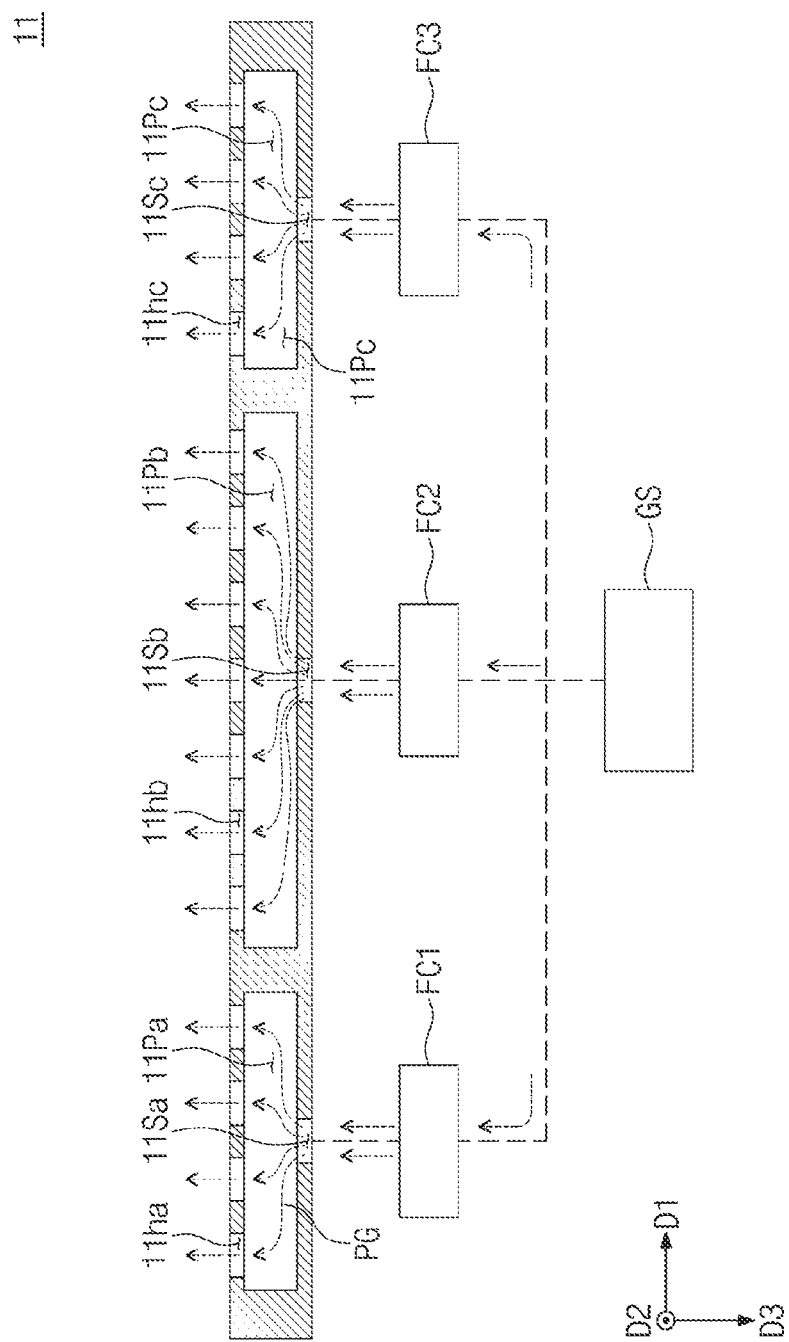

Referring to FIGS. 6 and 7 together with FIG. 4, the supplying of the process gas to the gas supply bar (S31) may include supplying the process gas PG by the gas supply unit GS.

Referring to FIG. 6, the directions of ionized particles generated as a result of the supply of the process gas PG may be changed based on a magnetic field generated by the magnets 31m and 33m. The directions can be adjusted by implementing different types of the magnets 31m and 33m or ones with dynamically adjustable magnetic fields.

For example, a portion of the process gas PG may be supplied to the first flow path 11Pa via the first flow rate control device FC1 and the supply flow path 11Sa. In this case, the first flow rate control device FC1 may control the flow rate of the process gas flowing toward the first flow path 11Pa. For example, the first flow rate control device FC1 may control the flow rate of the process gas, which passes through the first flow rate control device FC1, to a first flow rate.

In addition, another portion of the process gas PG may be supplied to the second flow path 11Pb via the second flow rate control device FC2 and the supply flow path 11Sb. Here, the second flow rate control device FC2 may control the flow rate of the process gas flowing toward the second flow path 11Pb. For example, the second flow rate control device FC2 may control the flow rate of the process gas, which passes through the second flow rate control device FC2, to a second flow rate.

Furthermore, the remaining portion of the process gas PG may be supplied to the third flow path 11Pc via the third flow rate control device FC3 and the third supply flow path 11Sc. Here, the third flow rate control device FC3 may control the flow rate of the process gas flowing toward the third flow path 11Pc. For example, the third flow rate control device FC3 may control the flow rate of the process gas, which passes through the third flow rate control device FC3, to a third flow rate.

In this process, each of the first flow rate, the second flow rate, and the third flow rate may be substantially the same. That is, flow rates of the process gas supplied to each of the first flow path 11Pa, the second flow path 11Pb, and the third flow path 11Pc may be all the same.

Alternatively, at least two of the first flow rate, the second flow rate, or the third flow rate may be different from each other. For example, the flow rate of the process gas supplied to the first flow path 11Pa and the flow rate of the process gas supplied to the second flow path 11Pb may be different from each other. The ratio among the first flow rate, the second flow rate, and the third flow rate may be appropriately determined according to a specific design application.

The distributing of the process gas from the gas supply bar (S32) may include spreading, in the first direction D1, the process gas PG that is introduced into the first flow path 11Pa through the first supply flow path 11Sa. That is, the process gas PG may be dispersed in the first direction D1 in the first flow path 11Pa.

In addition, the distributing of the process gas from the gas supply bar (S32) may include spreading, in the first direction D1, the process gas PG that is introduced into the second flow path 11Pb through the second supply flow path 11Sb. That is, the process gas PG may be dispersed in the first direction D1 in the second flow path 11Pb. However, since the second flow path 11Pb is separated from the first flow path 11Pa, the process gas PG of the second flow path 11Pb does not flow into the first flow path 11Pa.

Furthermore, the distributing of the process gas from the gas supply bar (S32) may include spreading, in the first direction D1, the process gas PG that is introduced into the third flow path 11Pb through the third supply flow path 11Sb. That is, the process gas PG may be dispersed in the first direction D1 in the third flow path 11Pc. However, since the third flow path 11Pc is separated from the second flow path 11Pb, the process gas PG of the third flow path 11Pc does not flow into the second flow path 11Pb.

The injecting of the process gas toward the rotary target (S33) may include injecting the process gas PG in the first flow path 11Pa toward the rotary target 31 and 33 through the first injection hole 11$ha$. In addition, the process gas PG in the second flow path 11Pb may be injected toward the rotary targets 31 and 33 through the second injection hole 11$hb$. Furthermore, the process gas PG in the third flow path 11Pc may be injected toward the rotary targets 31 and 33 through the third injection hole 11$hc$.

Figure 8:
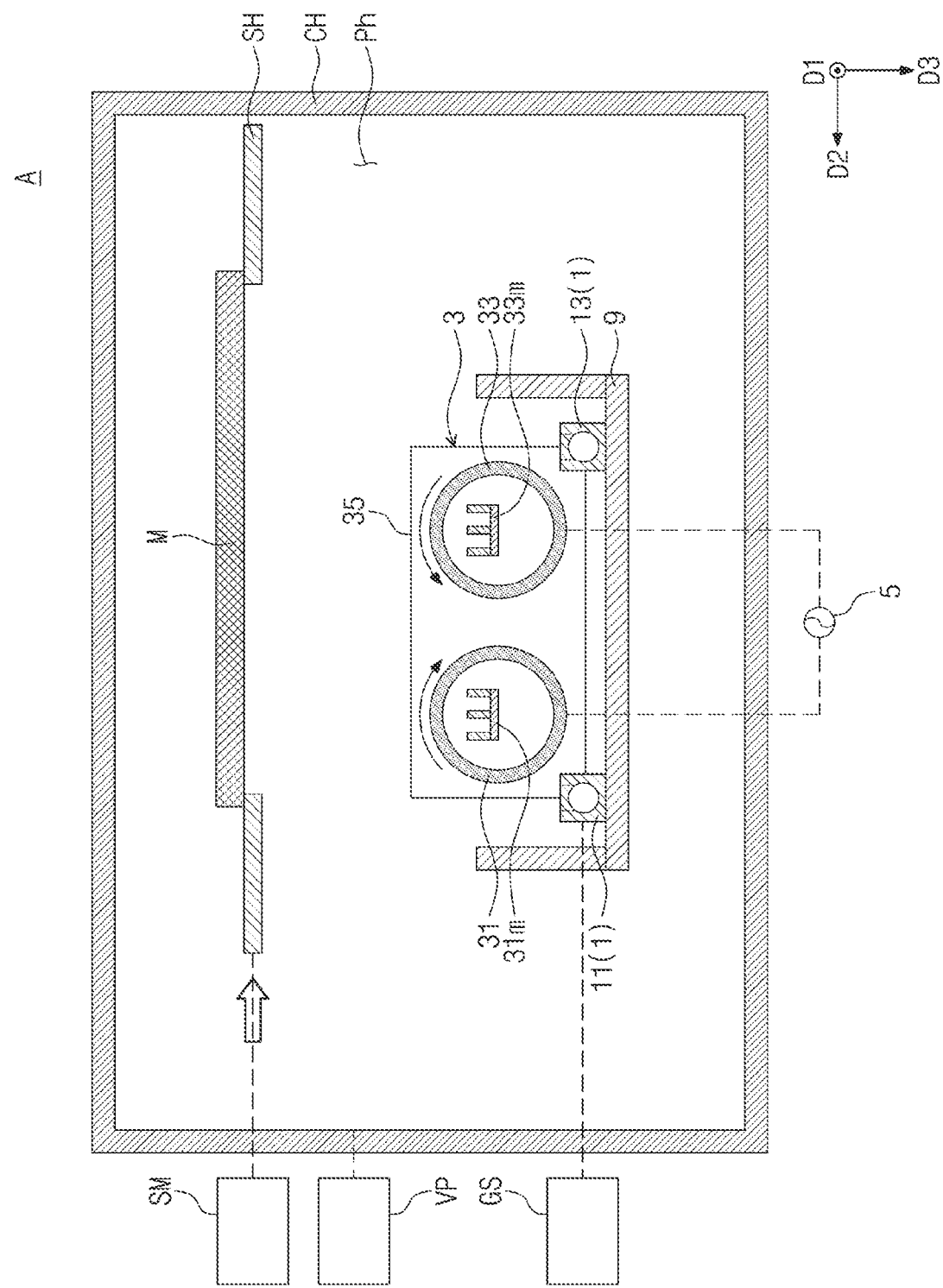

Referring to FIG. 8 together with FIG. 4, the applying of an AC voltage to the rotary target (S4) may include applying an AC voltage to the first rotary target 31 and the second rotary target 33 by the voltage application device 5. In addition, each of the first rotary target 31 and the second rotary target 33 may rotate by the rotation driving device 35. The process gas, which is injected to the first rotary target 31 and the second rotary target 33 in the supplying of a process gas into the sputtering apparatus (S3), may collide with the first rotary target 31 and the second rotary target 33, and may separate particles constituting the first rotary target 31 and the second rotary target 33. The particles separated from the rotary target may be deposited on the CVD mask M. Accordingly, the surface of the CVD mask M may be coated. Since the first rotary target 31 and the second rotary target 33 rotate, the target material may be continuously and uniformly deposited on the CVD mask M even if particles of the target material are separated by the process gas PG from one side of the surfaces of the first rotary target 31 and the second rotary target 33.

According to materials, constituting the first rotary target 31 and the second rotary target 33, and process gases, the surface of the CVD mask M may be coated with various materials. In an embodiment, one of the first rotary target 31 and the second rotary target 33 are omitted.

For example, when the process gas contains oxygen ($O_2$) and the first rotary target 31 and the second rotary target 33 contain aluminum (Al), the CVD mask M may be coated with aluminum oxide ($Al_2O_3$).

Alternatively, when the process gas contains oxygen ($O_2$) and nitrogen ($N_2$) and the first rotary target 31 and the second rotary target 33 contain aluminum (Al), the CVD mask M may be coated with aluminum oxide ($Al_2O_3$) and aluminum oxynitride (AlON).

Alternatively, when the process gas contains nitrogen ($N_2$) and the first rotary target 31 and the second rotary target 33 contain aluminum (Al), the CVD mask M may be coated with aluminum oxynitride (AlON).

Alternatively, when the process gas contains oxygen ($O_2$) and the first rotary target 31 and the second rotary target 33 contain titanium (Ti), the CVD mask M may be coated with titanium oxide ($TiO_3$).

Alternatively, when the process gas contains nitrogen ($N_2$) and the first rotary target 31 and the second rotary target 33 contain titanium (Ti), the CVD mask M may be coated with titanium nitride (TiN).

Alternatively, when the process gas contains nitrogen ($N_2$) and the first rotary target 31 and the second rotary target 33 contain silicon (Si), the CVD mask M may be coated with silicon nitride ($Si_3N_4$).

Alternatively, when the process gas contains oxygen ($O_2$) and the first rotary target 31 and the second rotary target 33 contain tantalum (Ta), the CVD mask M may be coated with tantalum oxide ($Ta_2O_5$).

Alternatively, when the process gas contains oxygen ($O_2$) and the first rotary target 31 and the second rotary target 33 contain zinc (Zn), the CVD mask M may be coated with zinc oxide (ZnO).

Although various process gases and various target materials have been exemplarily described above, embodiments of the inventive concept are not limited thereto. That is, when other process gases and other target materials not described herein are used, the CVD mask M may be coated with other materials.

During the process, the CVD mask M may be moved. For example, when one side of the CVD mask M is completely coated, the substrate holder SH may be moved by the substrate moving device SM so that the CVD mask M may be moved in the second direction D2 and/or in a direction opposite to the second direction D2. Accordingly, the entire surface of the CVD mask M having a large area may be coated.

In addition, although it has been illustrated and described that the substrate holder SH is disposed above the target device 3, embodiments of the inventive concept are not limited thereto. That is, an entire configuration may be turned upside down so that the substrate is positioned under the target device 3 and the gas supply bar 1 is positioned above the target device 3. Alternatively, the entire sputtering apparatus (A) illustrated in FIG. 1 may be arranged to lie on its side.

According to the sputtering apparatus according to embodiments of the inventive concept and the CVD mask coating method using the same, a plurality of flow paths may be provided separated in the sputtering apparatus along a longitudinal direction of the gas supply bar. The process gases respectively supplied to the plurality of flow paths may be uniformly distributed along the longitudinal direction of the gas supply bar. Accordingly, the process gas may be uniformly supplied to the process space. As the process gas is uniformly supplied to the process space, a difference in coating thickness between a center region of the substrate and an edge region of the substrate may be reduced. Alternatively, a non-uniform coating may be mitigated by differently controlling the flow rates of the process gases supplied to respective regions on the basis of the deposition result. In any of the above methods, the surface of the substrate may be coated to a uniform thickness.

According to the sputtering apparatus according to embodiments of the inventive concept and the CVD mask coating method using the same, it may be possible to supply a process gas optimized for a rotary sputtering apparatus. In the rotary sputtering apparatus, the sputtered particles may be dispersed in the longitudinal direction of the rotary target. In addition, the deposition process may be performed while the substrate is moved in a direction perpendicular to the longitudinal direction of the rotary target. Here, if the uniformity in the longitudinal direction of the rotary target is reduced, the uniformity of the coating thickness between the edge region and the center region of the substrate may be reduced. According to the inventive concept, the distribution of the process gas along the longitudinal direction of the rotary target may be controlled. Therefore, it is possible to perform uniform coating even on a large-area substrate using a rotary sputtering apparatus.

According to the sputtering apparatus according to embodiments of the inventive concept and the CVD mask coating method using the same, a variety of process gases and target materials may be used to coat the CVD mask. Accordingly, it is possible to prevent the CVD mask from being damaged by plasma during the CVD process and causing foreign substances such as particles. In addition, since it is possible to prevent damage to the CVD mask, a replacement cycle of the CVD mask may be increased. Accordingly, overall process costs may be reduced.

Figure 9:
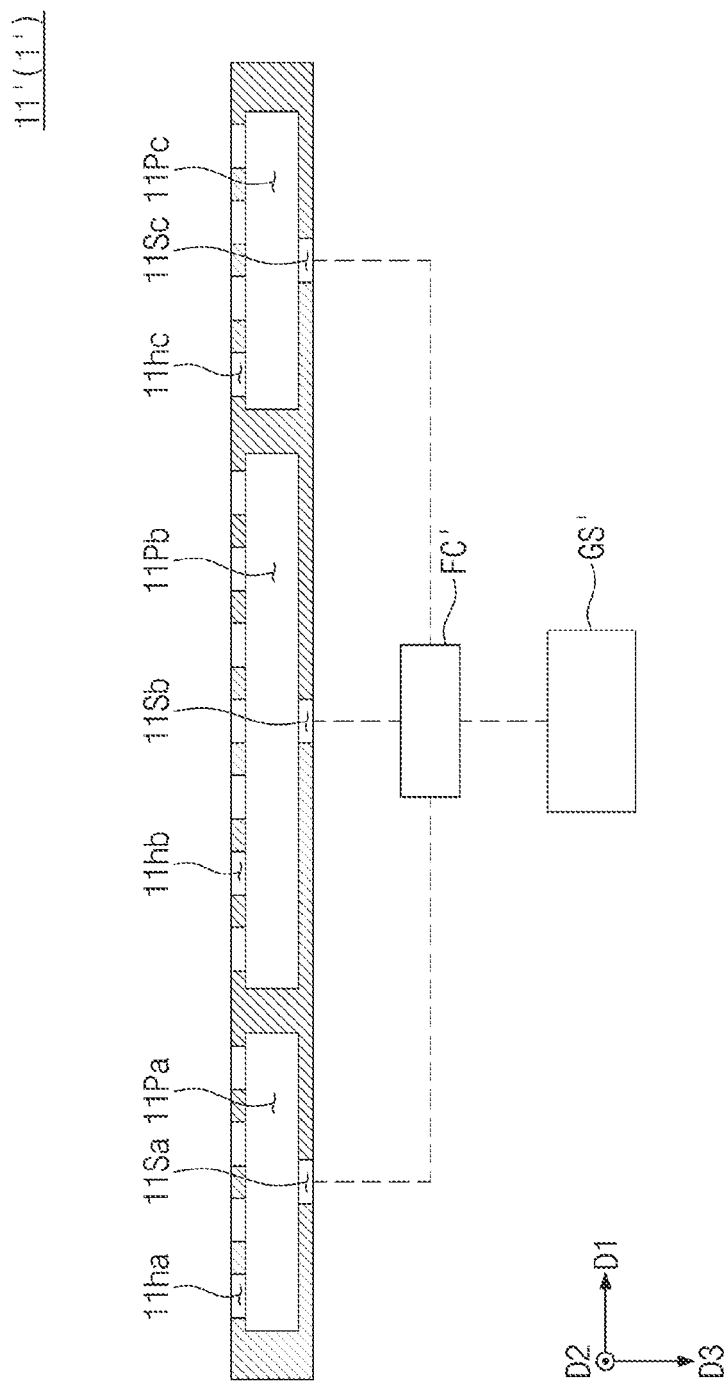
FIG. 9 is a cross-sectional view illustrating a gas supply bar of a sputtering apparatus according to an embodiment of the inventive concept.

FIG. 9 is a cross-sectional view illustrating a gas supply bar of a sputtering apparatus according to an embodiment of the inventive concept.

Hereinafter, descriptions of contents substantially identical or similar to those described with reference to FIGS. 1 to 8 may be omitted.

Referring to FIG. 9, one flow rate control device FC' is connected to a first gas supply bar 11'. The flow rate of the process gas supplied from a gas supply unit GS' to the plurality of flow paths 11Pa, 11Pb, and 11Pc may be controlled through the one flow rate control device FC'. The first gas supply bar 11' may be the same as the first gas supply bar 11. The flow rate control device FC' may have three outlets connected respectively to the flow paths 11Pa, 11Pb, and 11Pc for supplying gas from the gas supply unit GS'. The flow rate control device FC' may control flow rates of the flow paths 11Pa, 11Pb, and 11Pc to be the same as one another or set at least two of the flow rates to be different from one another.

Figure 10:
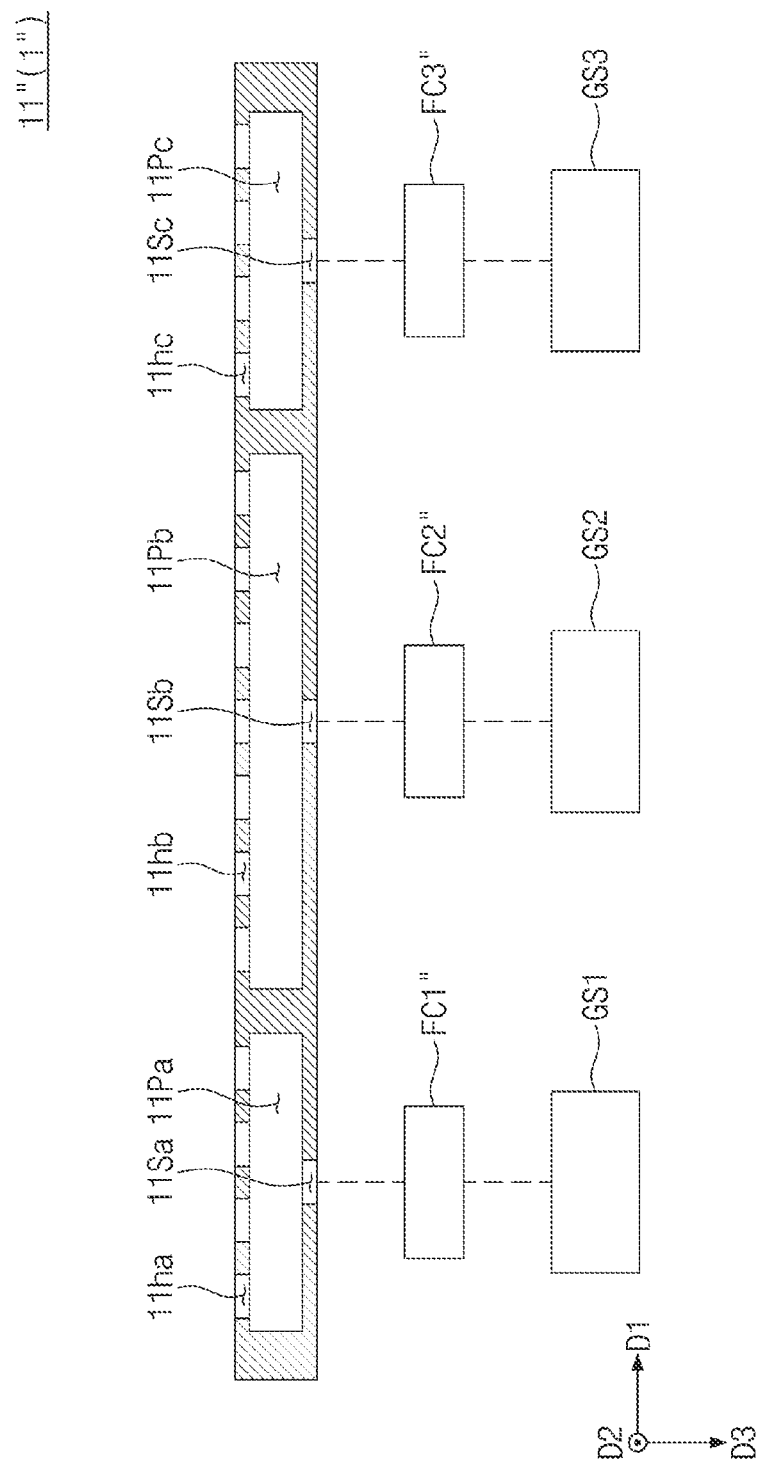
FIG. 10 is a cross-sectional view illustrating a gas supply bar of a sputtering apparatus according to an embodiment of the inventive concept.

FIG. 10 is a cross-sectional view illustrating a gas supply bar of a sputtering apparatus according to an embodiment of the inventive concept.

Hereinafter, descriptions of contents substantially identical or similar to those described with reference to FIGS. 1 to 9 may be omitted.

Referring to FIG. 10, a plurality of gas supply units may be connected to a first gas supply bar 11". The gas supply bar 11" may be the same as the gas supply bar 11. For example, a first gas supply unit GS1 may be connected to the first flow path 11Pa through a first flow rate control device FC1". In addition, a second gas supply unit GS2 may be connected to the second flow path 11Pb through a second flow rate control device FC2". Furthermore, a third gas supply unit GS3 may be connected to the third flow path 11Pc through a third flow rate control device FC3".

A process gas provided by the first gas supply unit GS1 may be the same as a process gas provided by the second gas supply unit GS2. Alternatively, the process gas provided by the first gas supply unit GS1 may be different from the process gas provided by the second gas supply unit GS2. Accordingly, different types of process gases may be supplied to the first flow path 11Pa and the second flow path 11Pb.

According to the sputtering apparatus according to embodiments of the inventive concept and the CVD mask coating method using the same, the different types of process gases may be supplied to different locations through the plurality of gas supply units. Accordingly, the coating layer may be deposited on the substrate through various methods.

Figure 11:
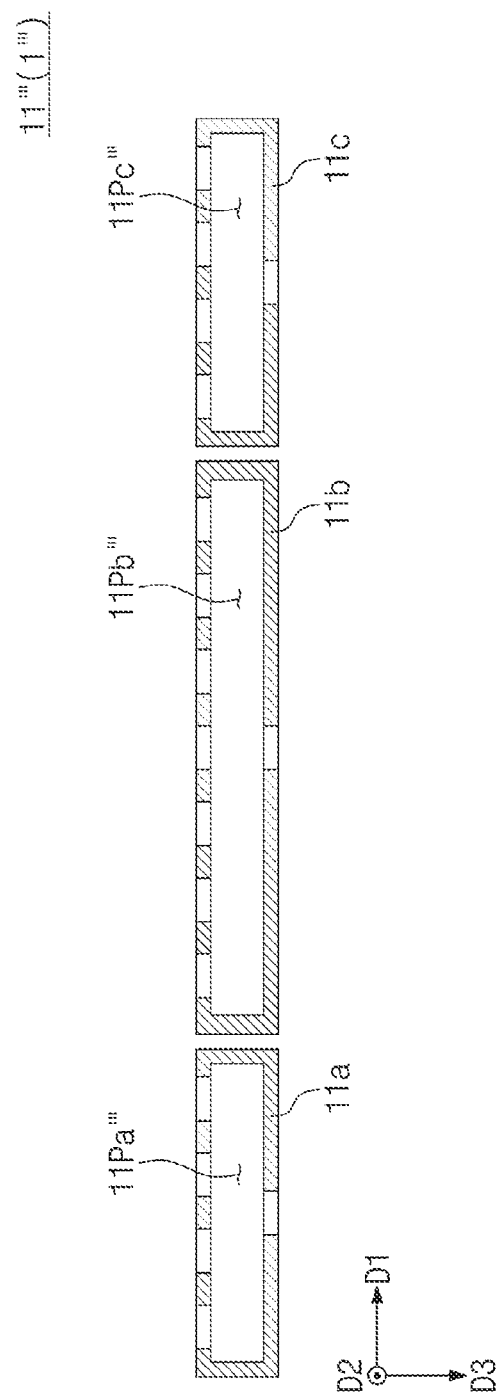
FIG. 11 is a cross-sectional view illustrating a gas supply bar of a sputtering apparatus according to an embodiment of the inventive concept.

FIG. 11 is a cross-sectional view illustrating a gas supply bar of a sputtering apparatus according to an embodiment of the inventive concept.

Hereinafter, descriptions of contents substantially identical or similar to those described with reference to FIGS. 1 to 10 may be omitted.

Referring to FIG. 11, a first gas supply bar 1F" may be divided into a plurality of pieces. For example, the first gas supply bar 11'" may include a first supply bar 11a, a second supply bar 11b, and a third supply bar 11c. The first gas supply bars 11, 11', or 11" may be replaced with the first gas supply bar 11'". The first supply bar 11a, the second supply bar 11b, and the third supply bar 11c are spaced apart from each other. More specifically, the first supply bar 11a, the second supply bar 11b, and the third supply bar 11c may be disposed to be spaced apart from each other in the first direction D1. Accordingly, a first flow path 11Pa'", a second flow path 11Pb'", and a third flow path 11Pc'" may also be spaced apart from each other in the first direction D1.

According to a sputtering apparatus according to an embodiment of the inventive concept, and a CVD mask coating method using the same, it is possible to control a coating thickness to be uniform.

According to a sputtering apparatus according to an embodiment of the inventive concept, and a CVD mask coating method using the same, it is possible to control process gas distributions for respective regions differently to adjust a coating thickness.

According to a sputtering apparatus according to an embodiment of the inventive concept, and a CVD mask coating method using the same, it is possible to coat a surface of a CVD mask with various materials using various process gases.

Although embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A sputtering apparatus comprising:
   a gas supply bar;
   a target device positioned at one side of the gas supply bar and spaced apart from the gas supply bar in a vertical direction and including a rotation driving device and a rotary target extending from the rotation driving device in a first horizontal direction;
   a support unit that supports the gas supply bar and the target device; and
   a substrate holder positioned opposite the gas supply bar with respect to the rotary target,
   wherein the gas supply bar includes a first flow path extending in the first horizontal direction, and a second flow path spaced apart from the first flow path in the first horizontal direction and separated from the first flow path.

2. The sputtering apparatus of claim 1, wherein the gas supply bar further comprises:
   a plurality of first injection holes extending from the first flow path toward the rotary target; and
   a plurality of second injection holes extending from the second flow path toward the rotary target, the plurality of first injection holes being spaced apart from each other in the first direction, and the plurality of second injection holes being spaced apart from each other in the first direction.

3. The sputtering apparatus of claim 1, further comprising a gas supply device configured to supply a process gas to the gas supply bar, wherein the gas supply bar further comprises:
   a first supply flow path configured to connect the first flow path and the gas supply device; and
   a second supply flow path configured to connect the second flow path and the gas supply unit, and spaced apart from the first supply flow path in the first direction.

4. The sputtering apparatus of claim 3, further comprising:
   a first flow rate control device disposed between the gas supply device and the first supply flow path and configured to control a flow rate of the gas supplied to the first supply flow path; and
   a second flow rate control device disposed between the gas supply device and the second supply flow path and configured to control a flow rate of the gas supplied to the second supply flow path.

5. The sputtering apparatus of claim 1, further comprising:
   a first gas supply device configured to supply a first process gas to the first flow path; and
   a second gas supply device configured to supply, to the second flow path, a second process gas that is different from the first process gas,
   wherein the gas supply bar further comprises a first supply flow path configured to connect the first flow path and the first gas supply device, and a second supply flow path configured to connect the second flow path and the second gas supply device.

6. The sputtering apparatus of claim 1, wherein a first length of the first flow path in the first direction and a second length of the second flow path in the first direction are different from each other.

7. The sputtering apparatus of claim 6, wherein a ratio of the first length to the second length is about 1:1.5.

8. The sputtering apparatus of claim 1, wherein the gas supply bar further comprises a third flow path extending in the first direction, wherein the second flow path is located between the first flow path and the third flow path.

9. A sputtering apparatus comprising:
   a rotation driving device;
   a first rotary target extending from the rotation driving device in a first horizontal direction;
   a second rotary target extending from the rotation driving device in the first horizontal direction and spaced apart from the first rotary target in a second horizontal direction crossing the first horizontal direction; and
   a gas supply bar spaced apart from the first rotary target and the second rotary target in a vertical direction,
   wherein the gas supply bar comprises a first flow path extending in the first horizontal direction, and a second flow path spaced apart from the first flow path in the first horizontal direction and separated from the first flow path,
   wherein the gas supply bar is positioned at one side of a first corner of the rotation driving device.

10. The sputtering apparatus of claim 9, further comprising a second gas supply bar disposed on a second corner of the rotation driving device with a same structure as the gas supply, and the two gas supply bars are spaced apart from each other in the second horizontal direction.

11. The sputtering apparatus of claim 9, further comprising:
   a gas supply device configured to supply a process gas to each of the first flow path and the second flow path;
   a first flow rate control device disposed between the gas supply device and the first flow path; and
   a second flow rate control device disposed between the gas supply device and the second flow path.

12. The sputtering apparatus of claim 9, wherein the gas supply bar further comprises:
   a first injection hole extending from the first flow path toward the first rotary target, and a second injection hole extending from the second flow path toward the first rotary target.

13. The sputtering apparatus of claim 9, further comprising:
   a rotation driving device configured to rotate each of the first rotary target and the second rotary target, and a voltage applying device configured to apply alternating current (AC) power to the first rotary target and the second rotary target.

14. The sputtering apparatus of claim 9, further comprising a substrate holder positioned opposite the gas supply bar with respect to the first rotary target, and a substrate moving apparatus configured to move the substrate holder in the second direction.

15. A chemical vapor deposition (CVD) mask coating method comprising:
   disposing a CVD mask on a substrate holder of a sputtering apparatus;
   applying vacuum pressure to an inside of the sputtering apparatus;
   supplying a process gas to a gas supply bar positioned inside the sputtering apparatus; and applying alternating current (AC) voltage to a rotary target within the sputtering apparatus, wherein the rotary target has a cylindrical shape extending in a first direction,
wherein a support unit of the sputtering apparatus supports a target device including a rotation driving device and spaced apart from the gas supply bar in a vertical direction and the gas supply bar,
wherein the rotary target extends from the rotation driving device in a first horizontal direction.

16. The CVD mask coating method of claim 15, wherein the supplying of the process gas comprises:
supplying the process gas from a gas supply device to the gas supply bar;
distributing the process gas along the first direction in the gas supply bar; and
injecting the process gas toward the rotary target from the gas supply bar, and wherein the gas supply bar comprises a first flow path extending in the first direction, and a second flow path spaced apart from the first flow path in the first direction and separated from the first flow path.

17. The CVD mask coating method of claim 16, wherein the distributing of the process gas comprises:
distributing the process gas supplied to the first flow path in the first direction within the first flow path; and
distributing the process gas supplied to the second flow path in the first direction within the second flow path.

18. The CVD mask coating method of claim 16, wherein the supplying of the process gas to the gas supply bar comprises:
controlling the process gas supplied to the first flow path to have a first flow rate through a first flow rate control device between the gas supply device and the first flow path; and
controlling the process gas supplied to the second flow path to have a second flow rate that is different from the first flow rate through a second flow rate control device between the gas supply device and the first flow path.

19. The CVD mask coating method of claim 15, wherein the rotary target includes one of aluminum (Al), titanium (Ti), silicon (Si), tantalum (Ta), or zinc (Zn).

20. The CVD mask coating method of claim 15, wherein the process gas includes at least one of oxygen ($O_2$), nitrogen ($N_2$), or Argon (Ar).

* * * * *